(12) United States Patent
Zou et al.

(10) Patent No.: US 9,331,048 B2
(45) Date of Patent: May 3, 2016

(54) BONDED STACKED WAFERS AND METHODS OF ELECTROPLATING BONDED STACKED WAFERS

(71) Applicant: Maxim Integrated Products, Inc., San Jose, CA (US)

(72) Inventors: Quanbo Zou, Plano, TX (US); Uppili Sridhar, Plano, TX (US); Amit S. Kelkar, Flower Mound, TX (US); Xuejun Ying, San Jose, CA (US)

(73) Assignee: Maxim Integrated Products, Inc., San Jose, CA (US)

(*) Notice: Subject to any disclaimer, the term of this patent is extended or adjusted under 35 U.S.C. 154(b) by 0 days.

(21) Appl. No.: 14/605,486

(22) Filed: Jan. 26, 2015

(65) Prior Publication Data
US 2015/0132891 A1    May 14, 2015

Related U.S. Application Data

(63) Continuation of application No. 13/018,534, filed on Feb. 1, 2011, now Pat. No. 8,970,043.

(51) Int. Cl.
*H01L 23/02* (2006.01)
*H01L 23/48* (2006.01)
(Continued)

(52) U.S. Cl.
CPC .............. *H01L 24/83* (2013.01); *B81C 3/001* (2013.01); *C25D 7/123* (2013.01); *C25D 17/001* (2013.01); *C25D 17/005* (2013.01); *C25D 17/007* (2013.01); *H01L 23/481* (2013.01); *H01L 25/50* (2013.01); *B81C 2201/0197* (2013.01); *B81C 2203/035* (2013.01); *H01L 24/13* (2013.01); *H01L 24/94* (2013.01); *H01L 2224/13144* (2013.01); *H01L 2225/06513* (2013.01);

(Continued)

(58) Field of Classification Search
CPC ............... H01L 2924/00; H01L 2924/10253; H01L 2924/12042; H01L 2924/1461; H01L 2924/00014; H01L 2924/01068; H01L 2924/30101; H01L 2225/06513; H01L 2225/06541; H01L 23/481; H01L 24/13; H01L 24/83; H01L 24/94; H01L 25/50; H01L 2224/13144; C12M 27/12; C12M 29/00; C12M 37/00; B81C 2201/0197; B81C 2203/035; B81C 3/001; C25D 17/001; C25D 17/005; C25D 17/007; C25D 17/123
USPC ................. 438/107; 257/686, 762, 763, 774, 257/E23.011, E23.067, E23.174
See application file for complete search history.

(56) References Cited

U.S. PATENT DOCUMENTS 5,426,072 A    6/1995   Finnila
6,162,344 A    12/2000  Reid et al.
(Continued)

OTHER PUBLICATIONS

Office Action dated Jan. 30, 2014 from the China Patent Office for Chinese Patent Application No. 201210022462.4.

*Primary Examiner* — Teresa M Arroyo (57) ABSTRACT

A method including: providing a first wafer stack; applying a first bonding layer on the first wafer stack; providing a second wafer stack, where the second wafer stack includes vias; and applying a second bonding layer to the second wafer stack. The vias extend through the second wafer stack and to the second bonding layer. The second bonding layer is bonded to the first bonding layer. A seed layer is applied on a side of the second wafer stack opposite the second bonding layer such that a material of the seed layer (i) contacts the vias, and (ii) extends over and past ends of the second wafer stack and onto the first bonding layer.

20 Claims, 4 Drawing Sheets

(51) Int. Cl.
   *H01L 23/52* (2006.01)
   *H01L 29/40* (2006.01)
   *H01L 23/00* (2006.01)
   *B81C 3/00* (2006.01)
   *C25D 7/12* (2006.01)
   *C25D 17/00* (2006.01)
   *H01L 25/00* (2006.01)

(52) U.S. Cl.
   CPC ........... *H01L2225/06541* (2013.01); *H01L 2924/01068* (2013.01); *H01L 2924/10253* (2013.01); *H01L 2924/12042* (2013.01); *H01L 2924/1461* (2013.01); *H01L 2924/30101* (2013.01)

(56) References Cited

U.S. PATENT DOCUMENTS

| | | | |
|---|---|---|---|
| 6,303,413 B1 | 10/2001 | Kalnitsky et al. |
| 7,224,042 B1 | 5/2007 | McCollum |
| 7,393,758 B2 | 7/2008 | Sridhar et al. |
| 7,691,748 B2 | 4/2010 | Han |
| 7,858,441 B2 | 12/2010 | Lin et al. |
| 8,623,763 B2 | 1/2014 | West |
| 2008/0318361 A1 | 12/2008 | Han et al. |
| 2009/0070727 A1 | 3/2009 | Solomon |
| 2009/0224371 A1 | 9/2009 | Yu et al. |
| 2009/0261457 A1 | 10/2009 | Pratt |
| 2009/0278244 A1 | 11/2009 | Dunne et al. |
| 2009/0283872 A1 | 11/2009 | Lin et al. |
| 2009/0289722 A1 | 11/2009 | Dropmann et al. |
| 2010/0013060 A1 | 1/2010 | Lamy et al. |
| 2010/0044826 A1 | 2/2010 | Farooq et al. |
| 2010/0047964 A1 | 2/2010 | Farooq et al. |
| 2010/0133704 A1 | 6/2010 | Marimuthu et al. |
| 2010/0140779 A1 | 6/2010 | Lin et al. |
| 2010/0178747 A1 | 7/2010 | Ellul et al. |
| 2010/0187557 A1 | 7/2010 | Samoilov et al. |
| 2010/0187670 A1 | 7/2010 | Lin et al. |
| 2010/0193964 A1 | 8/2010 | Farooq et al. |
| 2010/0200412 A1 | 8/2010 | Reid et al. |
| 2010/0206737 A1 | 8/2010 | Preisser |
| 2010/0237471 A1 | 9/2010 | Pagaila et al. |
| 2010/0314711 A1 | 12/2010 | Farooq et al. |
| 2011/0031633 A1 | 2/2011 | Hsu et al. |
| 2011/0198721 A1 | 8/2011 | Yang et al. |
| 2011/0215360 A1 | 9/2011 | Wang |
| 2012/0193808 A1 | 8/2012 | Zou et al. |
| 2012/0225509 A1 | 9/2012 | Wang |

FIG. 5

BONDED STACKED WAFERS AND METHODS OF ELECTROPLATING BONDED STACKED WAFERS

CROSS-REFERENCE TO RELATED APPLICATIONS

The present disclosure is a continuation of U.S. patent application Ser. No. 13/018,534 filed on Feb. 1, 2011. The entire disclosure of the application referenced above is incorporated herein by reference.

FIELD

The present disclosure relates to bonded stacked wafers.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

A bonded wafer stack includes two wafer stacks bonded together via bonding layers. Each of the wafer stacks may include semiconductor wafers that are stacked during fabrication and a bonding (metal) layer. Each semiconductor wafer may include one or more integrated circuits (ICs) with respective electronic components. A top surface of the bonded wafer stack may be electroplated during fabrication. In order to electroplate the top surface, a seed layer is applied to the top surface prior to electroplating. The seed layer allows electroplating material (or a metal layer) to be attached to the top surface.

The seed layer is applied across the top surface and over peripheral edges of a first (top) one of the wafer stacks. Electroplating pins are connected to the seed layer proximate the peripheral edges to supply current to the seed layer during electroplating. Electroplating requires a conductive path from the electroplating pins at the peripheral edges to all regions of the top surface of the wafer stack.

The seed layer can have discontinuities (or gaps) along the peripheral edges of the bonded wafer stack. The discontinuities can be due to the shape (sharp corners) of the peripheral edges and/or due to overhang areas of one or more layers of the bonded wafer stack. For example, the first one of the two wafer stacks may be larger than and extend over (i.e. overhang) a first bonding layer in an overhang area. The first bonding layer may be disposed between and used to bond the two wafer stacks. The seed layer may be applied over the first wafer stack and over the overhang area. The sharp edges of the first wafer stack and the overhang area can result in discontinuities in the seed layer.

The discontinuities can negatively affect thickness uniformity of an electroplate layer that is formed across the top surface of the bonded wafer stack during the electroplating process. Thicknesses of the electroplate layer are a function of the conductivities and/or resistances of the seed layer. The larger the discontinuities and/or the more discontinuities that exist in the seed layer, the more the thickness of the electroplate layer varies across the top surface of the bonded wafer stack.

Resistances between a center of the top surface of the bonded wafer stack and the electroplating pins can vary, for example, between tens to hundreds of ohms. This variance in resistance can result in electroplate layer thickness non-uniformity, depending upon the average electroplate layer thickness.

SUMMARY

A method is provided and includes: providing a first wafer stack; applying a first bonding layer on the first wafer stack; providing a second wafer stack, where the second wafer stack includes vias; and applying a second bonding layer to the second wafer stack. The vias extend through the second wafer stack and to the second bonding layer. The second bonding layer is bonded to the first bonding layer. A seed layer is applied on a side of the second wafer stack opposite the second bonding layer such that a material of the seed layer (i) contacts the vias, and (ii) extends over and past ends of the second wafer stack and onto the first bonding layer.

In other features, a method is provided and includes: providing a first wafer stack; applying a first bonding layer on the first wafer stack; providing a second wafer stack, where the second wafer stack includes vias; and applying a second bonding layer to the second wafer stack. The vias extend through the second wafer stack and to the second bonding layer. The second bonding layer is bonded to the first bonding layer. A seed layer is applied on a side of the second wafer stack opposite the second bonding layer such that a material of the seed layer contacts the vias. Electroplating pins are attached to the seed layer. The material of the seed layer contacts the first bonding layer outside an outer periphery of the second wafer stack and in an area between the second wafer stack and the electroplating pins.

In other features, a method is provided and includes: providing a first wafer stack; applying a first bonding layer on the first wafer stack; providing a second wafer stack, where the second wafer stack includes vias; and applying a second bonding layer to the second wafer stack. The vias extend through the second wafer stack and to the second bonding layer. The second bonding layer is bonded to the first bonding layer. A seed layer is applied on a side of the second wafer stack opposite the second bonding layer such that the seed layer has gaps at edges of the second wafer stack. The seed layer has a first portion and second portions. The gaps exist between (i) the first portion and (ii) the second portions. A material of the seed layer fills the vias. The material of the seed layer contacts the second bonding layer at each of the vias.

In other features, a wafer structure is provided and includes a first wafer stack and a first bonding layer disposed on the first wafer stack. The wafer structure further includes a second wafer stack that includes a first surface and a second surface opposing the first surface. A second bonding layer is disposed on the second surface and is in contact with the first bonding layer. The second wafer stack comprises through-silicon-vias (TSVs) that extend from the first surface to the second bonding layer. A seed layer is disposed on the first surface and is in contact with the TSVs.

In other features, a method of electroplating a wafer structure is provided. The method includes providing a first wafer stack with a first surface and a second surface that opposes the first surface. TSVs are formed in the first wafer stack and extend from the first surface to the second surface. A seed layer is applied on the first surface. The seed layer is electroplated based on characteristics of the TSVs.

In yet other features, a wafer structure fabrication method is provided. The wafer structure fabrication method includes the method of electroplating a wafer structure. The wafer structure fabrication method further includes applying a first bonding layer to the second surface of the first wafer stack. A second wafer stack is provided. A second bonding layer is applied to the second wafer stack. The first bonding layer is aligned with and bonded to the second bonding layer. The first bonding layer and the second bonding layer are metal layers.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF DRAWINGS

The present disclosure will become more fully understood from the detailed description and the accompanying drawings, wherein.

DESCRIPTION

The following description is merely illustrative in nature and is in no way intended to limit the disclosure, its application, or uses. For purposes of clarity, the same reference numbers will be used in the drawings to identify similar elements. As used herein, the phrase at least one of A, B, and C should be construed to mean a logical (A or B or C), using a non-exclusive logical OR. It should be understood that steps within a method may be executed in different order without altering the principles of the present disclosure.

As used herein, the term module may refer to, be part of, or include an Application Specific Integrated Circuit (ASIC); an electronic circuit; a combinational logic circuit; a field programmable gate array (FPGA); a processor (shared, dedicated, or group) that executes code; other suitable components that provide the described functionality; or a combination of some or all of the above, such as in a system-on-chip. The term module may include memory (shared, dedicated, or group) that stores code executed by the processor.

The term code, as used above, may include software, firmware, and/or microcode, and may refer to programs, routines, functions, classes, and/or objects. The term shared, as used above, means that some or all code from multiple modules may be executed using a single (shared) processor. In addition, some or all code from multiple modules may be stored by a single (shared) memory. The term group, as used above, means that some or all code from a single module may be executed using a group of processors. In addition, some or all code from a single module may be stored using a group of memories.

The apparatuses and methods described herein may be implemented by one or more computer programs executed by one or more processors. The computer programs include processor-executable instructions that are stored on a non-transitory tangible computer readable medium. The computer programs may also include stored data. Non-limiting examples of the non-transitory tangible computer readable medium are nonvolatile memory, magnetic storage, and optical storage.

In the following description, various terms are used to describe the physical relationship between components. When a first element is referred to as being "on", "engaged to", "connected to", "disposed on", "applied on" or "coupled to" a second element, the first element may be directly on, engaged, connected, disposed, applied, or coupled to the second element, or intervening elements may be present. In contrast, when an element is referred to as being "directly on", "directly engaged to", "directly connected to", "directly disposed on", "directly applied on" or "directly coupled to" another element, there may be no intervening elements present. Other words used to describe the relationship between elements should be interpreted in a like fashion (e.g., "between" versus "directly between", "adjacent" versus "directly adjacent", etc.).

Although the terms first, second, third, etc. may be used herein to describe various elements, components, regions, areas, layers and/or sections, these elements, components, regions, areas, layers and/or sections should not be limited by these terms. These terms may be only used to distinguish one element, component, region, layer or section from another element, component, region, layer or section. Terms such as "first," "second," and other numerical terms when used herein do not imply a sequence or order unless clearly indicated by the context. Thus, a first element, component, region, area, layer or section discussed below could be termed a second element, component, region, area, layer or section without departing from the teachings herein.

In the following description a "bonded wafer stack" or "wafer stack" may refer to one or more 3-D integrated circuits (ICs) that include stacked semiconductor wafers prior to or subsequent to dicing. Dicing refers to a process of separating dies (chips and/or chip stacks) from a wafer stack or a bonded wafer stack. Each IC of a semiconductor wafer may include one or more modules and/or electronic components. The modules and/or electronic components may include processors, switches, capacitances, diodes, inductances, resistances, pins, etc. A bonded wafer stack or wafer stack may include one or more stacks of semiconductor chips. Each stack of semiconductor chips may be integrated into a single system-in-package (SIP).

A bonded wafer stack may include two or more wafer stacks bonded together, where each wafer stack may be a single IC (or semiconductor chip) or include multiple ICs (or semiconductor chips) prior to dicing. A bonded wafer stack or wafer stack may include one or more micro-electro-mechanical systems (MEMs), such as sensors, relays, accelerometers, gyros, resonators, actuators, traducers, microengines, etc.

Figure 1:
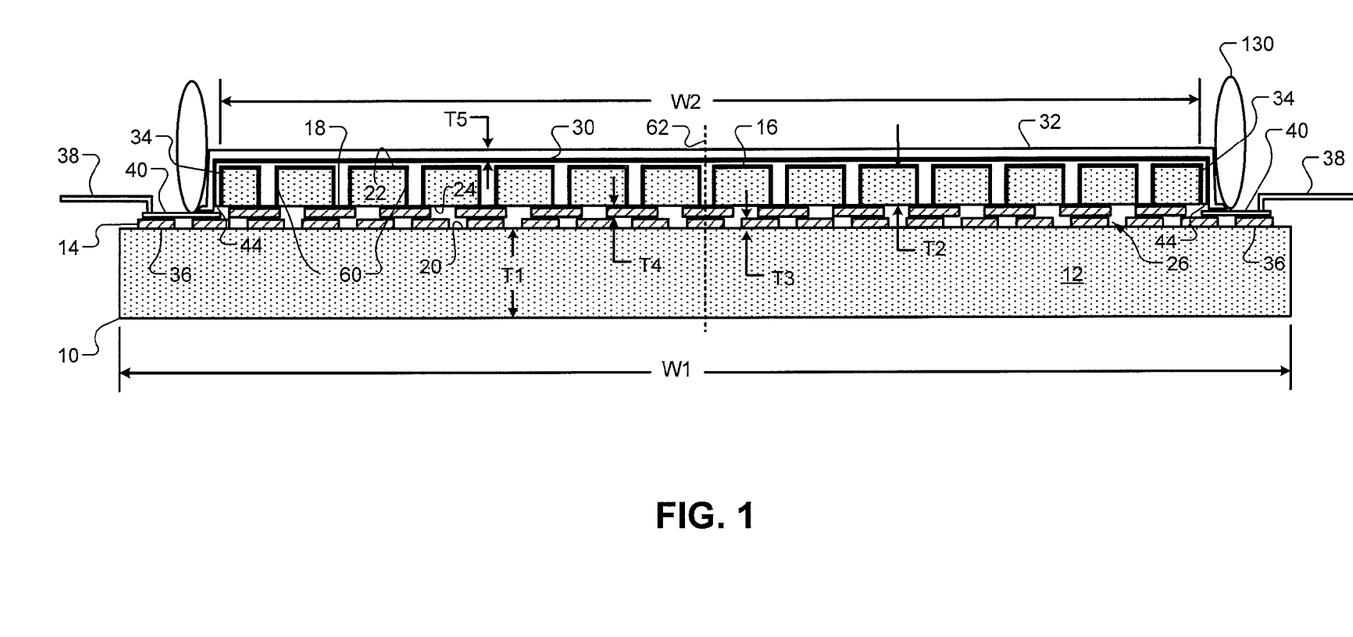
FIG. 1 is a cross-sectional side view of a bonded wafer stack (wafer structure) in accordance with the present disclosure.

In FIG. 1, a cross-sectional side view of a bonded wafer stack 10 (wafer structure) is shown. The bonded wafer stack 10 includes a first (bottom) wafer stack 12, a first bonding layer 14, a second (top) wafer stack 16, and a second bonding layer 18. The first bonding layer 14 is attached to a top surface 20 of the first wafer stack 12. The second wafer stack 16 includes a first (top) surface 22 and a second (bottom) surface 24 and may be referred to as a "top silicon stopping". The second bonding layer 18 is attached to the second surface 24 and is bonded to the first bonding layer 14 (in a bonding region 26). The second surface 24 is adjacent to and in contact with the second bonding layer 18 and opposes the first bonding layer 14.

Each of the wafer stacks 12, 16 may include one or more semiconductor wafers; each of the semiconductor wafers may include one or more ICs. Each of the wafer stacks 12, 16 may be a bonded wafer stack and include one or more bonding regions. Put another way, the first wafer stack 12 and the second wafer stack 16 may be single wafer stacks or may include multiple wafer stacks with respective bonding regions.

Although a first width W1 of the first wafer stack 12 is shown as being greater than a second width W2 of the second wafer stack 16, the first width W1 may be equal to or less than the second width W2. Surface area of the second surface 24 may be smaller than a corresponding surface area of the first bonding layer 14. The width and surface area relationships between the first wafer stack 12 and the second wafer stack 16 and between the wafer stacks 12, 16 and the bonding layers 14, 18 may be determined and set for manufacturing compatibility reasons. The relationships may be determined and set to prevent chipping and cracking of layers in the bonded wafer stack 10.

Although the first wafer stack 12 and the second wafer stack 16 may include various conductive and non-conductive materials, the exterior surfaces or regions of the first wafer stack 12 and the second wafer stack 16 may be generally non-conductive. The exterior regions may be formed of, for example, silicon and/or other suitable materials. Electronic components and circuit interconnections of the first wafer stack 12 and the second wafer stack 16 may be formed of metal. In one example implementation, the first wafer stack 12 may have a first thickness T1 of, for example, approximately 700 microns (μ). In the same example implementation, a second thickness T2 of the second wafer stack is approximately 5-100μ. In another example implementation the second thickness T2 is approximately 40-80μ.

The first bonding layer 14 and the second bonding layer 18 are conductive layers and may be formed of, for example, gold (Au) and/or other metals and/or other suitable conductive bonding materials. In one example implementation, the first bonding layer 14 and the second bonding layer 18 have respective thicknesses T3, T4 of 1-5μ. In another example implementation, the thicknesses T3, T4 are approximately the same or approximately 2.9μ±0.1μ.

The bonded wafer stack 10 further includes a seed layer 30 and an electroplate layer 32. The seed layer 30 is applied to the top surface 22 to allow electroplating of the second wafer stack 16 to form the electroplate layer 32. The seed layer 30 may include one or more layers and may be formed of, for example, Au, copper (Cu), titanium (Ti), tungsten (W), and/or other suitable metal and adhesive materials and/or a combination thereof. In one example implementation, the seed layer 30 includes a first (top) layer and a second (bottom or adhesive) layer. The top layer may include, for example, Au and/or Cu (e.g., 1 kilo-angstrom (kA) of Au). The bottom layer may include, for example, Ti and W (e.g., 1 kA of TiW). The seed layer 30 may be, for example, 0.1-0.2μ thick.

The seed layer 30 extends across the top surface 22, overlaps peripheral edges 34 of the second wafer stack 16, is applied on ends 36 of the first bonding layer 14. Electroplating pins 38 may be connected to ends 40 of the seed layer 30. Due to the shape and overhang of the peripheral edges 34, discontinuities 44 can result in the seed layer 30 during fabrication. One of the discontinuities can be seen in FIG. 2.

Figure 2:
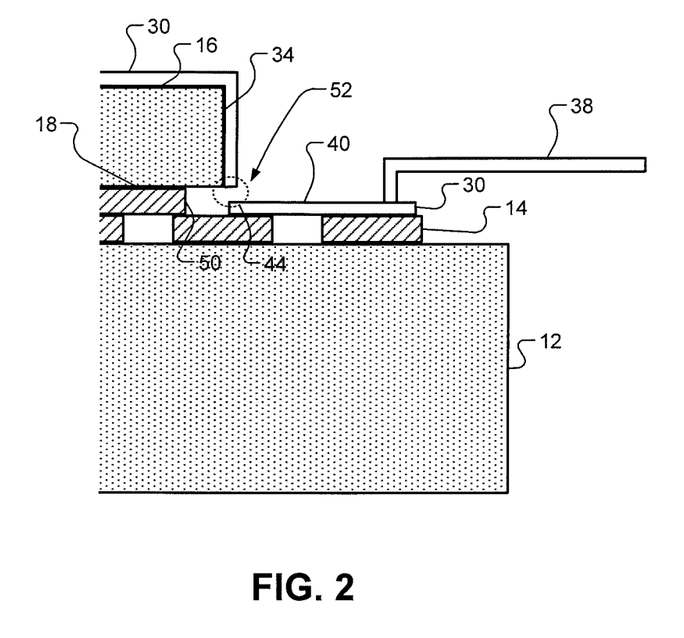
FIG. 2 is a cross-sectional side end view of a portion of the bonded wafer stack of FIG. 1.

Referring also to FIG. 2, a cross-sectional side end view of a portion of the bonded wafer stack 10 is shown. The bonded wafer stack 10 includes the first wafer stack 12, the first bonding layer 14, the second wafer stack 16, the second bonding layer 18, and the seed layer 30. The seed layer 30 includes the discontinuities 44 (one is shown and circled in FIG. 2) at the peripheral edges 34 of the second wafer stack 16, at edges 50 of the second bonding layer 18, and above the first bonding layer 14. The discontinuities 44 may occur vertically below the second wafer stack 16 and where the second wafer stack 16 overhangs the second bonding layer 18. Seed layer material may enter void areas 52 between the first wafer stack 12 and the second wafer stack 16 at the edges 50 resulting in thinning of the seed layer 30 in the void areas 52.

To minimize or eliminate the effect of the discontinuities 44 in the seed layer 30, the second wafer stack 16 includes through-silicon-vias (TSVs) 60. The TSVs 60 are provided to reduce resistances across the second wafer stack 16 between the electroplating pins 38 and centers of at least one of the second wafer stack 16, the seed layer 30 and the electroplate layer 32. The TSVs 60 may be provided regardless of whether there are discontinuities 44 in the seed layer. The centers are represented by dashed center line 62. The TSVs 60 can reduce the resistances by an order of magnitude relative to a bonded wafer stack without the TSVs 60. Incorporation of the TSVs 60 enables uniform electroplating of the bonded wafer stack.

The TSVs 60 extend through the second wafer stack 16 between the top and bottom surfaces 22, 24 and may each contact the seed layer 30 and/or the second bonding layer 18. The seed layer 30 when applied may fill the TSVs 60 to contact the second bonding layer 18 and/or the first bonding layer 14 at each of the TSVs 60. This connects the electroplate layer 32 to the bonding layers 14, 18 using a metal network with vertical electric paths (i.e. the filled TSVs 60). The bonding layers 14, 18 provide increased conductivity between (i) areas of the seed layer 30 and/or electroplate layer 32 and (ii) peripheral edges of the bonded wafer stack 10 and the electroplating pins 38. The seed layer 30 does not include bumps over the TSVs 60 due to the filling of the TSVs 60. This provides a flat uniform surface over which to form the electroplate layer 32.

The TSVs 60 may have various characteristics, such as: a number of TSVs per unit area of a die (referred to as die pitch); a number of TSVs per unit area of a wafer stack (referred to as wafer stack pitch), a number of TSVs per active area of an IC (referred to as IC pitch), dimensions (e.g., height, width, depth, diameter), a TSV pattern, etc. The pattern of the TSVs 60 may be determined to provide conductive paths with minimal resistances to all areas of the seed layer 30 over the second wafer stack 16. The resistances may be less than, for example, 300 milliohms (mΩ). This provides a uniform thickness profile across the second wafer stack 16. Thickness of the electroplate layer 32 is designated T5. This provides electroplating thickness uniformity variance of less than approximately 2% (average thickness of the electroplate layer±1% across the electroplate layer), depending upon the average thickness of the electroplate layer. Electroplating thickness uniformity variance with the TSVs 60 may be less than approximately 2% with 1 sigma (δ) or standard deviation from the average thickness.

As a first reference example, resistances between edges and a center of a seed layer on a planar wafer (i.e. single wafer) can be approximately 0.35-0.42Ω. As another reference example, resistances between edges and a center of a seed layer on a wafer stack without TSVs can be approximately 0.53-27Ω. As yet another example, resistances between edges and a center of a seed layer on a wafer stack with TSVs as disclosed herein can be approximately 0.20-0.24Ω. As a result, incorporation of TSVs in stacked arrangements as disclosed herein provides resistances that are less than the planar arrangements and/or stacked arrangements without TSVs.

Figure 3:
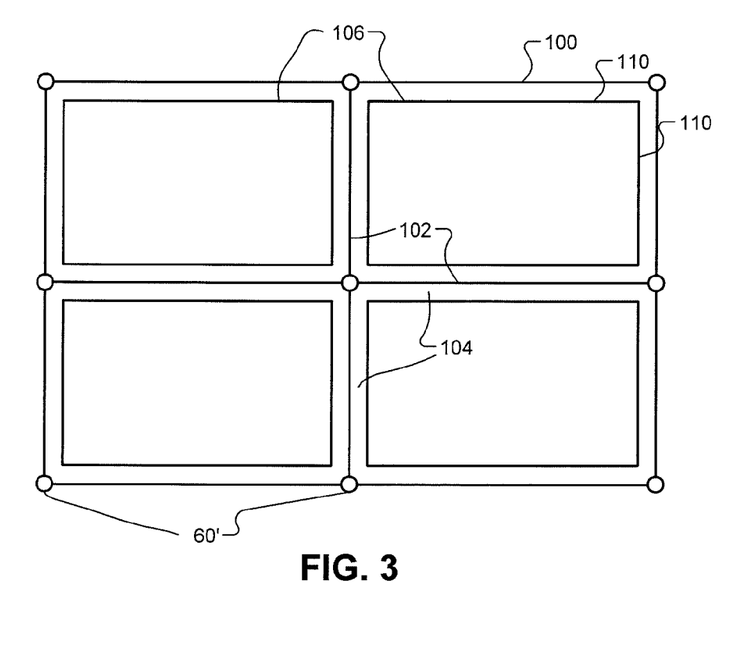
FIG. 3 is a bottom view of a wafer stack without a bonding layer in accordance with the present disclosure.
Figure 4:
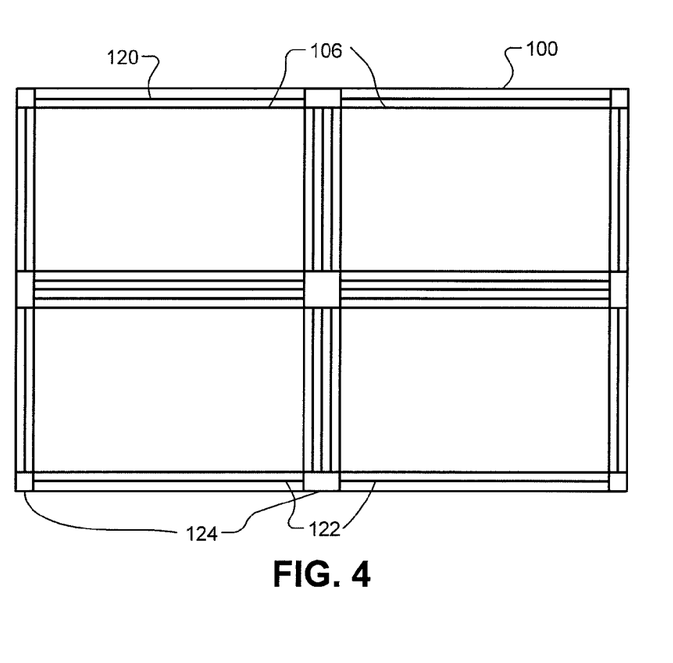
FIG. 4 is a bottom view of the wafer stack of FIG. 3 with a bonding layer and in accordance with the present disclosure.

The TSVs 60 may be located in various non-active regions of the bonded wafer stack 10. A non-active region may refer to a region of the bonded wafer stack 10 that does not include electronic components. Conversely, an active region may refer to a region of the bonded wafer stack 10 that does include electronic components. Some non-active region examples for TSVs are shown in FIGS. 3 and 4. Any number of TSVs (e.g., approximately 1000-10,000) may be incorporated in the bonded wafer stack 10.

Referring now also to FIG. 3, a bottom view of a wafer stack 100 (e.g., a view of the bottom surface 24 of the second wafer stack 16) without a metal bonding layer (e.g., without the second bonding layer 18) is shown. TSVs 60' are located along scribe lines 102 and in scribe lanes 104 of the wafer stack 100. The scribe lanes 104 refer to non-active regions between dies 106 where cutting of the wafer stack 100 is performed during dicing. The cutting may occur along the scribe lines 102. The TSVs 60' are located between the dies 106. The dies 106 may include active and non-active regions. The non-active regions may be referred to as dummy locations. The active regions may include IC areas with electronic components.

Although the TSVs 60' are shown at outer peripheral edges 110 of and external to the dies 106, alternative or additional TSVs may be formed in the non-active regions of and within the dies 106. The TSVs 60' may be arranged in various patterns across the wafer stack 100 and/or across each of the dies 106. Each of the dies 106 or groups of the dies 106 may include TSVs. The TSV patterns for each of the dies 106 may be the same or different. The number of TSVs may increase with an increase in the surface area (e.g., top or bottom surface area) of the wafer stack 100 and/or the surface areas of each of the dies 106. As the TSVs 60' are located in non-active regions, no additional surface area is needed in order to incorporate the TSVs 60'.

In FIG. 4, a bottom view of the wafer stack 100 of FIG. 3 with a bonding layer 120 (e.g., the second bonding layer 18 of FIG. 1) is shown. The wafer stack 100 includes the dies 106. The bonding layer 120 may be segmented, where each bonding layer segment 122 is associated with a respective one of the dies 106. The bonding layer segments 122 may cover active and/or non-active surface areas of the dies 106, as shown. TSV pads 124 may be included and located in areas beneath TSVs (such as the TSVs 60, 60' of FIGS. 1 and 3).

The TSV pads 124 may be formed of metal and/or conductive materials and connect the bonding layer segments 122 to conductive material in the TSVs. The conductive material in the TSVs may be, for example, portions of a seed layer that extend into the TSVs. The TSV pads 124 may have different shapes and sizes, as shown.

Referring again to FIG. 1, a seal ring 130 may be set over the bonded wafer stack 10 prior to electroplating. The seal ring 130 is used to maintain electroplating fluid over the second wafer stack 16. The seal ring 130 is removed subsequent to forming the electroplate layer 32.

The bonded wafer stack 10 may be formed using various methods. An example method is provided by the wafer structure fabrication method of FIG. 5. Although the following tasks are primarily described with respect to the implementations of FIG. 1, the tasks may be easily modified to apply to other implementations of the present disclosure. The method may begin at 200. The wafer structure fabrication method includes a method of electroplating a wafer structure (referred to as the electroplating method). The electroplating method may include, for example, tasks 210-224.

In the following tasks, a bonded wafer stack that includes multiple wafer stacks is formed. Each of the wafer stacks and/or the bonded wafer stack may be hermetically sealed. Hermetic seals (i.e., airtight seals) prevent entry of unwanted particles and elements in the bonded wafer stack.

Figure 5:
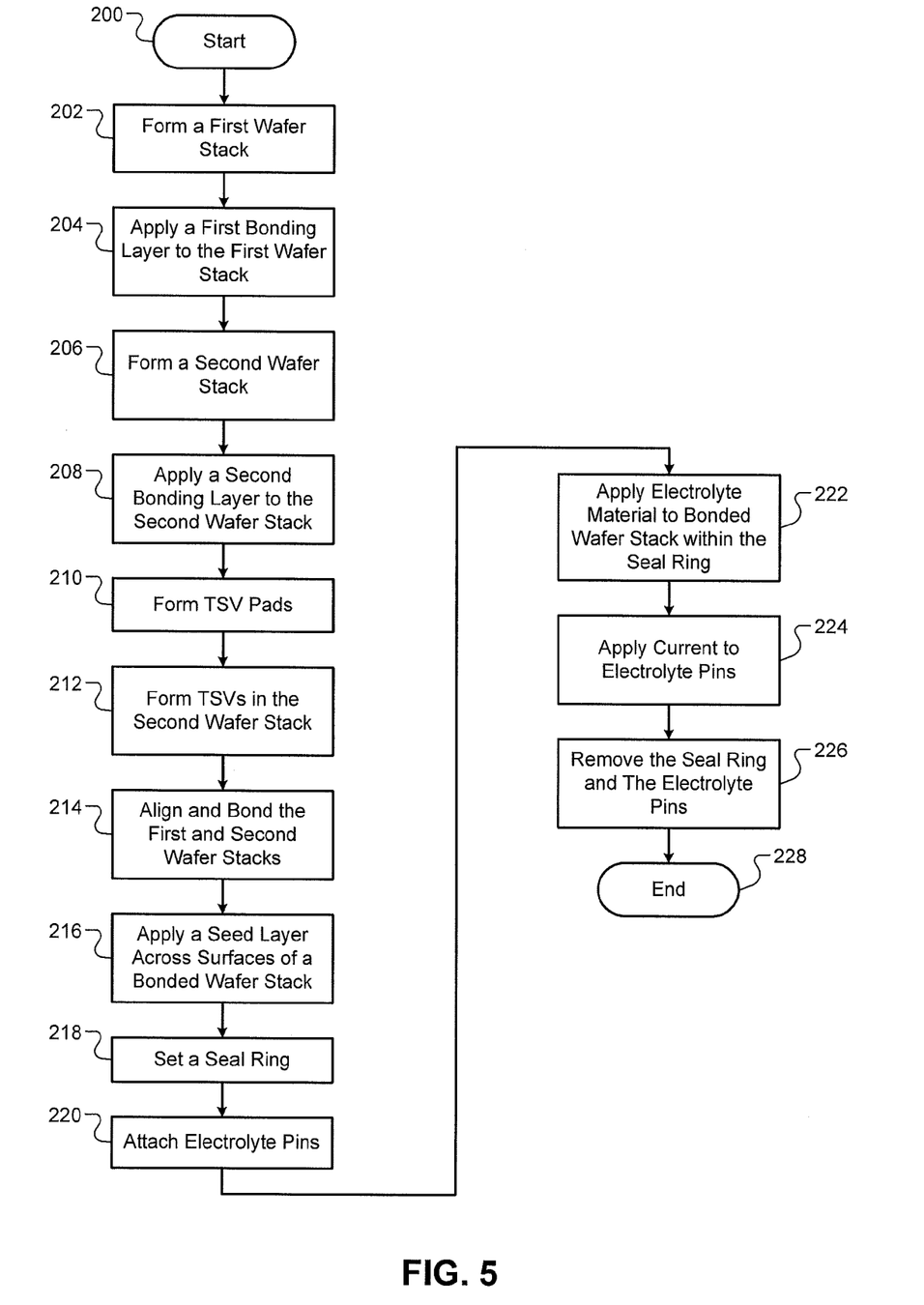
FIG. 5 is a wafer structure fabrication method in accordance with the present disclosure.

At 202, a first wafer stack (e.g., the first wafer stack 12) is formed. The first wafer stack may be formed of silicon and may include electronic devices and/or ICs. At 204, a first bonding (metal) layer (e.g., the first bonding layer 14) is applied to the first wafer stack.

At 206, a second wafer stack (e.g., the second wafer stack 16) is formed and includes a first surface and a second surface that opposes the first surface. The second wafer stack may be formed of silicon and may include electronic devices and/or ICs. At 208, a second bonding (metal) layer is applied to the second surface of the second wafer stack.

At 210, TSV pads (e.g., TSV pads 124 of FIG. 4) are formed on the second wafer stack. Tasks 208 and 210 may be formed during the same period. The TSV pads may be formed as part of the second bonding layer. The TSVs may extend from the second surface to the second bonding layer.

At 212, TSVs (e.g., the TSVs) are formed in the second wafer stack and extend from the first surface to the second surface. The TSVs may be formed, for example, by etching, drilling, milling, sand blasting, and/or water jetting the first wafer stack.

At 214, the first wafer stack is aligned with and bonded to the second wafer stack via the bonding layers. The bonding process forms a bonded wafer stack (e.g., the bonded wafer stack 10). The first bonding layer is bonded to and thus is in contact with the second bonding layer. This connects electronic components of the first wafer stack to electronic components of the second wafer stack. Task 212 may be performed subsequent to task 214.

At 216, a seed layer (e.g., the seed layer 30) is applied across the top surfaces of the bonded wafer stack. The seed layer is applied on the first surface of the second wafer stack and fills the TSVs. The seed layer may extend through each of the TSVs and contact the first bonding layer and/or the second bonding layer. The seed layer may also be applied over peripheral areas and/or edges of at least one of the first bonding layer and the first wafer stack, as shown in FIG. 1. The seed layer may be sputtered on the top surfaces of the bonded wafer stack or deposited using, for example, physical or chemical vapor deposition.

At 218, a seal ring (e.g., the seal ring 130) is set over the top of the bonded wafer stack to contain electroplating material. At 220, electroplating pins are attached to peripheral edges of the seed layer outside of the seal ring. The seal ring protects the electroplating pins during the electroplating process of tasks 222-224.

At 222, the electroplating material is applied to the bonded wafer stack, over the second wafer stack, and within the seal ring. At 224, a current is applied to the electroplating pins to electroplate the bonded wafer stack within the seal ring. This includes electroplating the seed layer to form an electroplate layer (e.g., the electroplate layer 32). Thickness uniformity of the electroplate layer depends upon TSV characteristics of the TSVs and the current applied to the electroplating pins. Example TSV characteristics are provided above. At 226, the seal ring and the electroplating pins may be removed from the bonded wafer stack. The wafer structure fabrication method may end at 228.

The above-described tasks are meant to be illustrative examples; the tasks may be performed sequentially, synchronously, simultaneously, continuously, during overlapping time periods or in a different order depending upon the application.

Subsequent to performing the wafer structure fabrication method of FIG. 5, the bonded wafer stack may be diced along scribe lines of the bonded wafer stack (referred to as the dicing process). The bonded wafer stack may be diced through the TSVs in the scribe lanes. Dies may be separated from the bonded wafer stack by, for example, mechanical sawing or laser cutting along the scribe lines. The dies (silicon chips) may be encapsulated into chip carriers or packages following the dicing process.

The above-described implementations provide uniform electroplating of a bonded wafer stack. The uniform electroplating is provided regardless of whether there are sharp corners and/or overhang areas over which a seed layer is applied. The uniform plating improves MEMs process integrity and performance controls The broad teachings of the disclosure can be implemented in a variety of forms. Therefore, while this disclosure includes particular examples, the true scope of the disclosure should not be so limited since other modifications will become apparent upon a study of the drawings, the specification, and the following claims.

What is claimed is:

1. A method comprising:
providing a first wafer stack;
applying a first bonding layer on the first wafer stack;
providing a second wafer stack, wherein the second wafer stack comprises through-silicon vias;
applying a second bonding layer to a first surface of the second wafer stack, wherein the through-silicon vias extend from the first surface through the second wafer stack and to the second bonding layer;
bonding the second bonding layer to the first bonding layer; and
applying a seed layer on a second surface of the second wafer stack opposite the second bonding layer such that a material of the seed layer (i) contacts the through-silicon vias, and (ii) extends over the first surface and past edges of the second wafer stack and onto the first bonding layer.

2. The method of claim 1, wherein the applying of the seed layer comprises filling the through-silicon vias with a portion of the seed layer.

3. The method of claim 1, wherein the applying of the seed layer comprises applying the material of the seed layer across the second wafer stack to edges of the first wafer stack such that the material contacts the first bonding layer between (i) the edges of the first wafer stack and (ii) edges of the second wafer stack.

4. The method of claim 1, further comprising electroplating a portion of the seed layer to form an electroplate layer, wherein:
the electroplate layer extends over the edges of the second wafer stack; and
the seed layer, at each of the through-silicon vias, connects the electroplate layer to the first bonding layer and the second bonding layer.

5. The method of claim 4, further comprising:
attaching electroplating pins to the seed layer prior to the electroplating of the portion of the seed layer, wherein the electroplating of the portion of the seed layer comprises applying current to the electroplating pins to electroplate the seed layer.

6. The method of claim 1, wherein:
providing the first wafer stack comprises providing a first plurality of wafers; and
providing the second wafer stack comprises providing a second plurality of wafers.

7. The method of claim 1, wherein the applying of the seed layer comprises applying the material of the seed layer such that the material (i) extends through the through-silicon vias, and (ii) contacts the second bonding layer and the seed layer.

8. The method of claim 1, wherein:
providing the second wafer stack comprises providing a plurality of dies; and
forming the through-silicon vias (i) in scribe lanes of the second wafer stack or (ii) between active regions of the plurality of dies.

9. A method comprising:
providing a first wafer stack;
applying a first bonding layer on the first wafer stack;
providing a second wafer stack, wherein the second wafer stack comprises through-silicon vias;
applying a second bonding layer to a first surface of the second wafer stack, wherein the through-silicon vias extend from the first surface through the second wafer stack and to the second bonding layer;
bonding the second bonding layer to the first bonding layer;
applying a seed layer on a second surface of the second wafer stack opposite the second bonding layer such that a material of the seed layer fills the through-silicon vias; and
attaching electroplating pins to the seed layer, wherein the material of the seed layer contacts the first bonding layer outside an outer periphery of the second wafer stack and in an area between the second wafer stack and the electroplating pins.

10. The method of claim 9, wherein the applying of the seed layer comprises filling the through-silicon vias with a portion of the seed layer.

11. The method of claim 9, wherein the seed layer is applied such that the material of the seed layer extends over and past edges of the second wafer stack and onto the first bonding layer.

12. The method of claim 9, further comprising:
electroplating a portion of the seed layer including applying current to the electroplating pins to electroplate the seed layer.

13. The method of claim 9, wherein:
providing the first wafer stack comprises providing a first plurality of wafers; and
providing the second wafer stack comprises providing a second plurality of wafers.

14. The method of claim 9, wherein the applying of the seed layer comprises applying the material of the seed layer such that the material (i) extends through the through-silicon vias, and (ii) contacts the second bonding layer and the seed layer.

15. A method comprising:
providing a first wafer stack;
applying a first bonding layer on the first wafer stack;
providing a second wafer stack, wherein the second wafer stack comprises through-silicon vias;
applying a second bonding layer to a first surface of the second wafer stack, wherein the through-silicon vias extend from the first surface through the second wafer stack and to the second bonding layer;
bonding the second bonding layer to the first bonding layer; and
applying a seed layer on a second surface of the second wafer stack opposite the second bonding layer such that the seed layer has gaps at edges of the second wafer stack, wherein the seed layer has a first portion and second portions, the gaps exist between (i) the first portion and (ii) the second portions, a material of the seed layer fills the through-silicon vias, and the material of the seed layer contacts the second bonding layer at each of the through-silicon vias.

16. The method of claim 15, wherein the applying of the seed layer comprises applying the material of the seed layer across the second wafer stack to edges of the first wafer stack such that the material contacts the first bonding layer between (i) the edges of the first wafer stack and (ii) edges of the second wafer stack.

17. The method of claim 15, further comprising:
electroplating the first portion of the seed layer to form an electroplate layer, wherein the electroplate layer extends over edges of the second wafer stack; and
connecting the seed layer, at each of the through-silicon vias, to the electroplate layer, to the first bonding layer and to the second bonding layer.

18. The method of claim 17, further comprising:
attaching electroplating pins to the seed layer prior to the electroplating of the first portion of the seed layer, wherein the electroplating of the first portion of the seed layer comprises applying current to the electroplating pins to electroplate the seed layer.

19. The method of claim 15, wherein:
providing the first wafer stack comprises providing a first plurality of wafers; and
providing the second wafer stack comprises providing a second plurality of wafers.

20. The method of claim 15, wherein the applying of the seed layer comprises applying the material of the seed layer such that the material (i) extends through the through-silicon vias, and (ii) contacts the second bonding layer and the seed layer.

* * * * *